United States Patent [19]

Okazaki et al.

[11] Patent Number: 4,476,411
[45] Date of Patent: Oct. 9, 1984

[54] RECTANGULAR THICKNESS SHEAR QUARTZ CRYSTAL OSCILLATOR

[75] Inventors: Masanobu Okazaki, Sayama; Satoshi Akutsu, Saitama; Susumu Ebihara, Sayama, all of Japan

[73] Assignee: Nihon Dempa Kogyo Co., Ltd., Tokyo, Japan

[21] Appl. No.: 341,245

[22] Filed: Jan. 21, 1982

Related U.S. Application Data

[63] Continuation of Ser. No. 104,910, Dec. 18, 1979, abandoned.

[30] Foreign Application Priority Data

Dec. 27, 1978 [JP] Japan ................................. 53-163250
Apr. 14, 1979 [JP] Japan ................................. 54-45559

[51] Int. Cl.$^3$ ............................................. H01L 41/08
[52] U.S. Cl. .................................... 310/361; 310/368; 310/348
[58] Field of Search ................ 310/360, 361, 367, 368

[56] References Cited

U.S. PATENT DOCUMENTS

| 2,169,301 | 8/1939 | Sykes ............................ 310/361 X |
| 3,311,854 | 3/1967 | Mason ........................... 310/361 X |
| 4,234,812 | 11/1980 | Kawashima ..................... 310/361 |

FOREIGN PATENT DOCUMENTS

| 2426338 | 12/1979 | France . | |
| 0040089 | 3/1977 | Japan ................................. 310/361 |
| 0069596 | 6/1977 | Japan ................................. 310/361 |
| 0132151 | 10/1979 | Japan ................................. 310/361 |
| 1401042 | 10/1975 | United Kingdom ................. 310/361 |
| 1538137 | 1/1979 | United Kingdom . | |
| 2021311 | 10/1979 | United Kingdom . | |
| 2032172 | 4/1980 | United Kingdom . | |

OTHER PUBLICATIONS

"Keeping the Bell System in Tune and One Time", Bell Laboratories Record, Band 55, No. 5, May 1977, pp. 137–141.
"Understanding Precision Crystal Time Bases", Electronics, Band 51, No. 17, Aug. 17, 1978, pp. 114–118.
Proceedings of the 32nd Annual Symposium on Frequency Control, 1978, pp. 267=276.
The Journal of the Acoustical Society of America, vol. 42, No. 6, 1967, pp. 1268–1277.

*Primary Examiner*—Mark O. Budd
*Attorney, Agent, or Firm*—Frishauf, Holtz, Goodman & Woodward

[57] ABSTRACT

A thickness shear quartz crystal oscillator has two major surfaces which extend in the direction the of X axis of the crystal and which are 5mm to 10mm long. X-Z plane defined by the X axis and Z axis of the crystal is rotated about the X axis by 35°08' to 35°16' so that the major surfaces are parallel to an X-Z' plane defined by the X axis and an imaginary Z' axis inclined to the Z axis at 35°08' to 35°16'. One of the major surfaces is displaced in the direction of the Z' axis to thereby cause the side faces of the oscillator to incline at an angle of 4° to 6°.

3 Claims, 9 Drawing Figures

RECTANGULAR THICKNESS SHEAR QUARTZ CRYSTAL OSCILLATOR

This is a continuation of application Ser. No. 104,910 filed Dec. 18, 1979, now abandoned.

BACKGROUND OF THE INVENTION

This invention relates to a thickness shear quartz crystal oscillator which can be made small and light and which has excellent electrical characteristics.

Generally, an AT-cut thickness shear quartz crystal oscillator exhibits a frequency-temperature characteristic which is represented by a three-dimensional curve and is stable against temperature variation. Thus, it is used as a reference frequency signal source in various electronic devices such as communication systems and electronic watches.

However, when used practically, the AT-cut thickness shear quartz crystal oscillator encounters various problems. To reduce the size of the oscillator without degrading its frequency-temperature characteristic so that the oscillator may be placed in a small casing of, for example, an electronic watch, the following problem will arise.

A known thickness shear quartz crystal oscillator is made of a quartz crystal plate which has a rectangular cross section and which extends in the direction of its X axis. The oscillator vibrates in a direction which is parallel to the X axis. To make the oscillator small, the crystal plate is cut at an angle of 34°45′ to 35°20″ (hereinafter called "cut angle") and is provided with an inclination angle of 2° to 16°. The cut angle and the inclination angle will be defined as follows.

Suppose the X-Z plane defined by the X and Z axes of the crystal plate is rotated about the X axis and that Y′ and Z′ axes are imagined which incline at the same angle to the Y and Z axes, respectively. Then, the "cut angle" is the angle at which X-Z′ plane defined by the X axis and the imaginary Z′ axis inclines to the X-Z plane. The "inclination angle" is the angle at which the side faces of the crystal plate incline when one of the major surfaces of the crystal plate which are parallel to the X-Z′ plane is displaced in the direction of the imaginary Z′ axis.

If cut at said cut angle and provided with said inclination angle, the crystal plate has its width reduced or it becomes shorter in the direction of the Z′ axis, without deteriorating its own frequency-temperature characteristic which is represented by a three-dimensional curve with an inflection point at about the room temperature. The above-mentioned method of shaping a crystal plate, however, fails to make the plate shorter in the direction of the X axis. That is, the method cannot reduce the length of the crystal plate, for the following reason.

As disclosed in "30th Annual Symposium on Frequency Control—1976" pages 196-201, an AT-cut quartz crystal oscillator having a cut angle of 35°30′, a length a along the X axis and a thickness b along the Y axis will have its frequency-temperature characteristic changed if the length a is reduced a little so that the ratio of a to b decreases from 2.935 to 2.745. More specifically, the inflection point will appear at a temperature of 60° C. to 80° C. That is, if the length of an AT-cut quartz oscillator is reduced, the inflection point will appear at a temperature far higher than the room temperature, and the three-dimensional curve showing the characteristic will become almost two-dimensional in the vicinity of the room temperature. If this happens, the quartz crystal oscillator cannot be used practically.

An object of this invention is to provide a thickness shear quartz crystal oscillator which can be made small and light and whose length can be reduced without deteriorating the electrical characteristics.

SUMMARY OF THE INVENTION

To accomplish the object, a thickness shear quartz crystal oscillator according to this invention comprises a quartz crystal plate having two major surfaces which extend in the direction of the X axis of the crystal plate, are 5 mm to 10 mm long and are parallel to a X-Z′ plane defined by the X axis and an imaginary Z′ axis inclining to the Z axis of the crystal at 35°08′ to 35°16′, one of the major surfaces being displaced in the direction of the Z′ axis to thereby cause the side faces of the crystal plate to incline at an angle of 4° to 6°.

Comprised of such a quartz crystal plate, the thickness shear quartz crystal oscillator exhibits a frequency-temperature characteristic which is represented by a three-dimensional curve with an inflection point at about the room temperature. The oscillator is therefore stable against temperature variation. Further it can be made small and light because its length can be reduced without deteriorating its electrical characteristics. Still further, it remains resistant to impact even if a pair of electrodes are led out from one of its ends. If led out in this way, the electrodes can be connected to lead wires of an external device much easier than if one of them is led out from the other end of the oscillator. This helps enhance the efficiency of manufacture, particularly when the oscillators are manufactured in large quantities.

DETAILED DESCRIPTION

Figure 1:
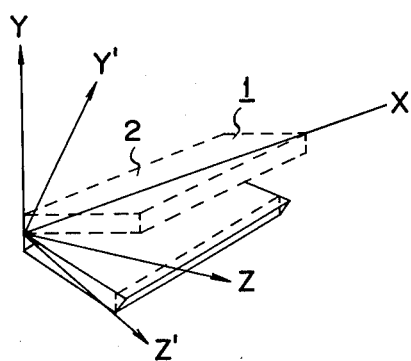
FIG. 1 is a diagram illustrating the cut angle, inclination angle and length of a thickness quartz crystal oscillator according to this invention.

A thickness shear quartz crystal oscillator of this invention comprises such a quartz crystal plate as shown in FIG. 1. The crystal plate 1 has two parallel major surfaces 2 which extend in the direction of the X axis of the crystal plate 1. The X-Z plane defined by the X and Z axes of the crystal plate 1 is rotated about the X axis by 35°08' to 35°16', thus providing imaginary Y' and Z' axes which incline to the Y and Z axes of the plate 1, respectively, at the same angle of 35°08' to 35°16'. As a result, the major surfaces 2 are positioned parallel to the X-Z' plane defined by the X and Z' axes. The upper major surface 2 of the crystal plate 1 is displaced in the direction of the Z' axis, thereby to cause the side faces of the plate 1 to incline at an angle of 4° to 6° (hereinafter called "inclination angle").

Figure 2:
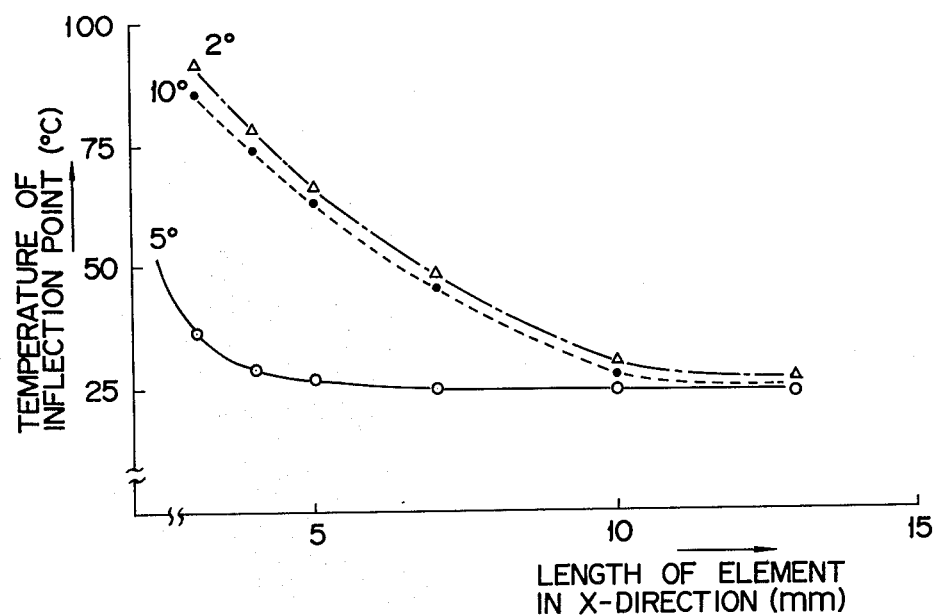
FIG. 2 is a graph showing the relationship between the lengths of oscillators of this invention and the temperature at which the inflection point appears, when the oscillators have different inclination angles and are excited with fundamental waves having a resonance frequency of a 4 MHz.

A number of thickness shear quartz crystal oscillators were made. They comprised crystal plates having the same thickness, the same width of 1.4 mm, the same cut angle of 35°10', different inclination angles of 2°, 5° and 10° and different lengths ranging from 3 mm to 15 mm. Fundamental waves having a resonance frequency of 4 MHz were applied to the oscillators. (Fundamental waves having a resonance frequency other than 4 MHz may of course be applied to the oscillators.) Then, the oscillators exhibited frequency-temperature characteristics which are represented by three-dimensional curves with inflection points. The oscillators which were 10 mm or more long showed such frequency-temperature characteristics with inflection points appearing at about the room temperature, no matter whether their inclination angles were 2°, 5° or 10°. The oscillators which were less than 10 mm long and had inclination angles 2° and 10° exhibited frequency-temperature characteristics with inflection points appearing at temperatures far higher than the room temperature. These oscillators could not therefore be used practically. By contrast, the oscillators which were less than 10 mm long and had an inclination angle of 5° exhibited frequency-temperature characteristics with inflection points appearing at a relatively low temperature, and these oscillators could be used practically. The results of this experiment shows, as illustrated in FIG. 2, that a thickness shear quartz crystal oscillator can be used practically if it is 5 mm to 10 mm long and has an inclination angle of 4° to 6°, because the inflection point appears at about the room temperature.

Figure 3:
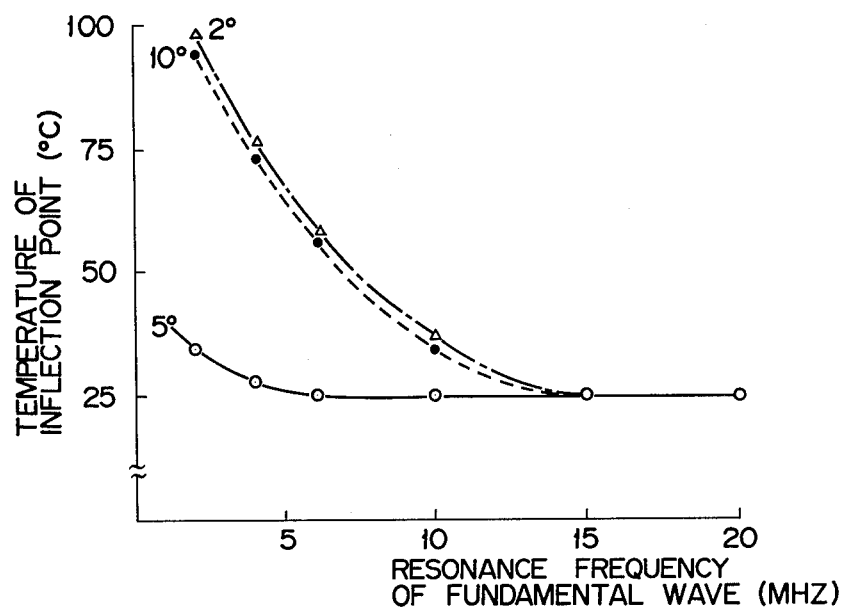
FIG. 3 is a graph showing the relationship between the resonance frequency and the temperature at which the inflection point appears, when the oscillators are 5 mm long and have different inclination angles.

Further, a number of thickness shear quartz crystal oscillators are made. They comprised quartz crystal plates having the same thickness, the same width of 1.4 mm, the same length of 5 mm and the same cut angle of 35°10'. Fundamental waves having different resonance frequencies were applied to these oscillators. Then, they exhibited frequency-temperature characteristics with inflection points appearing at such temperatures as illustrated in FIG. 3. As FIG. 3 shows, the temperature at which an inflection point appears depends on the inclination angle of the crystal plate. More specifically, when fundamental waves having a resonance frequency of 15 MHz or more were applied to the oscillators which had inclination angles of 2°, 5° and 10°, the inflection points appeared at about the room temperature. When fundamental waves having a resonance frequency of less than 15 MHz were applied to the oscillators which had an inclination angle of 2° or 10°, the inflection points appeared at such high temperatures that the oscillators could not be used practically. The results of the experiment show that a thickness shear quartz crystal oscillator which has an inclination angle of 5° or about 5° and is 5 mm to 10 mm long exhibits a frequency-temperature characteristic with an inflection point appearing at about the room temperature.

Figure 4:
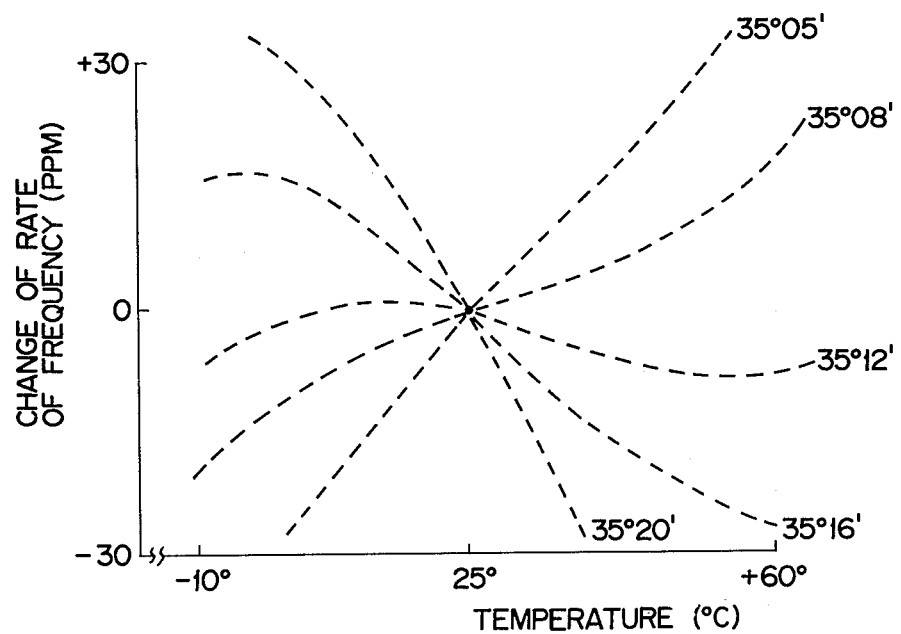
FIG. 4 is a graph showing the relationship between the ambient temperature and the rate of frequency change of the oscillators, with respect to oscillators having different cut angles.

As generally known, the frequency-temperature characteristic of an AT-cut thickness shear quartz crystal oscillator depends on the cut angle of its quartz crystal plate. A number of thickness shear quartz crystal oscillators were made. The oscillators comprised quartz crystal plates having the same thickness, the same width of 1.4 mm, different lengths of 5 mm to 10 mm and different inclination angles of 35°05', 35°08', 35°12', 35°16' and 35°20'. The output frequencies changed at different rates according to the ambient temperature as illustrated in FIG. 4. As FIG. 4 shows, the frequency changed at the rate of −30 ppm to +30 ppm at −10° C. to +60° C. as far as the oscillators having a cut angle of 35°08' to 35°16' are concerned. In other words, the oscillators having a cut angle within this range could be used practically. On the other hand, the frequency changed more abruptly at −10° C. to +60° C. as far as the oscillators having a cut angle outside this range are concerned. In other words, the oscillators having a cut angle of less than 35°08' or larger than 35°16' could not be used practically.

In the oscillators which are made and used in the above-mentioned experiments, the quartz crystal plates had the same width of 1.4 mm. The width the plates is not limited to 1.4 mm, of course.

Accordingly, a thickness shear quartz crystal oscillator of this invention comprises a quartz crystal plate which has a length of 5 mm to 10 mm along the X axis, a cut angle of 35°08' to 35°16' and an inclination angle of 4° to 6°. Provided with such quartz crystal plate, the oscillator exhibits a frequency-temperature characteristic which is represented by a three-dimensional curve with an inflection point appearing at about the room temperature. The length of the crystal plate can be reduced without deteriorating the electric characteristics. Thus, the oscillator can be made small and placed in a small case of an electronic wristwatch.

As mentioned above, the electric characteristics of the thickness shear quartz crystal oscillator according to this invention are not deteriorated even if the length of the quartz crystal plate is reduced. The impact-resistance of the oscillator will not be degraded if a pair of electrodes are led out from one of the ends of the crystal plate.

Now referring to FIGS. 5 to 9, an embodiment of this invention will be described, in which a pair of electrodes are led out from one of the ends of a quartz crystal plate and are secured to a base.

Figure 5:
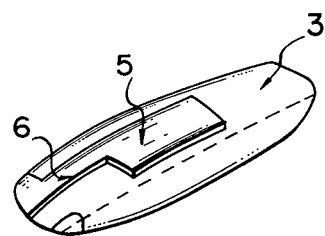
FIG. 5 is a perspective view of a thickness shear quartz crystal oscillator according to this invention.

FIG. 5 shows a thickness shear quartz crystal oscillator comprising a crystal piece 3 which has a length, a cut angle and an inclination angle-all within the above-mentioned ranges. The quartz crystal piece 3 has a curving surface. This piece 3 can be obtained by beveling the ends of a quartz crystal plate having a cut angle of 35°08' to 35°16', by placing the plate in a barrel together with an abrasive and by rotating the barrel at a high speed. An exciting electrode 5 is formed on one of the major surfaces of the piece 3 by vapor-deposition, and a lead electrode 6 is formed on the same major surface also by vapor-deposition.

Figure 6:
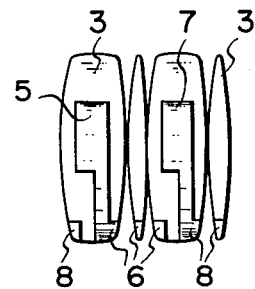
FIG. 6 shows the oscillator of FIG. 5 unfolded, illustrating how electrodes are formed on the major surfaces of the oscillator by vapor-deposition.
Figure 7:
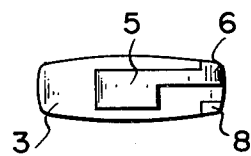
FIG. 7 is a front view of the oscillator of FIG. 5, which is provided with electrodes vapor-deposited.
Figure 8:
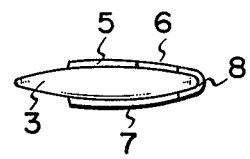
FIG. 8 is a side view of the oscillator of FIG. 5.

FIG. 6 shows the oscillator of FIG. 5 unfolded. FIGS. 7 and 8 are the front and side views of the oscillator of FIG. 5, respectively. As FIGS. 6, 7 and 8 show, on the major surface of the crystal piece 3 there are formed another exciting electrode 7 and another lead electrode 8, both by vapor-deposition. These electrodes 5, 6, 7 and 8 can be easily vapor-deposited on the major surfaces of the piece 3. Further, the electrodes 5 and 6 are mutually connected merely by forming them so as to overlap them one upon the other, thus without using a lead wire or an electrically conductive adhesive. The electrodes 7 and 8 are mutually connected in the same way. The lead electrodes 6 and 8 can be easily connected to external lead wires if they are so formed as to bend around one end of the oscillator 3, thus enhancing the efficiency of manufacture.

Figure 9:
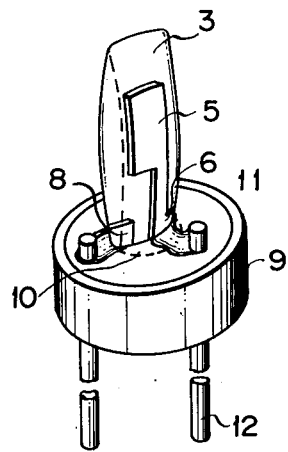
FIG. 9 is a perspective view of the oscillator shown in FIGS. 6 to 8, which is secured to a base.

FIG. 9 shows the thickness shear quartz crystal oscillator standing upright on a base 9. The lower end of the crystal piece 3 is bonded to the base 9 with an adhesive agent 10, and the lead electrodes 6 and 8 are connected to external terminals 12 through lead wires 11. If the piece 3 is supported on such a base, it is sufficiently resistive against impact because its length is reduced.

What we claim is:

1. A thickness shear quartz crystal oscillator comprising a quartz crystal plate having two major surfaces extending in the direction of the X axis of the crystal plate, said major surfaces being 5 mm to 10 mm long and being parallel to an X-Z' plane defined by the X axis and an imaginary Z' axis inclined to the Z axis of the crystal plate at 35°08' to 35°16', and the length/width ratio of said major surfaces being from 5:1.4 to 10:1.4, one of said major surfaces being displaced in the direction of the Z' axis to thereby cause the side faces of the crystal place to incline at an angle of 4° to 6°.

2. The thickness shear quartz crystal oscillator according to claim 1, which is dimensioned such that when it is excited with a fundamental harmonic frequency of 15 MHz or less, it exhibits a frequency-temperature characteristic with an inflection point which appears at about the room temperature.

3. The thickness shear quartz crystal oscillator according to claim 1 or claim 2, wherein only one end of the oscillator is secured to a base with the other end free, and further comprising a pair of lead electrodes led out from said one end of the oscillator and connected to external lead wires.

* * * * *